United States Patent
Nakagawa

(10) Patent No.: US 9,685,299 B2
(45) Date of Patent: Jun. 20, 2017

(54) SUBSTRATE PROCESSING APPARATUS, ETCHING METHOD OF METAL FILM, AND MANUFACTURING METHOD OF MAGNETORESISTIVE EFFECT ELEMENT

(71) Applicant: CANON ANELVA CORPORATION, Kawasaki-shi (JP)

(72) Inventor: Yukito Nakagawa, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 318 days.

(21) Appl. No.: 14/366,113

(22) PCT Filed: Dec. 19, 2012

(86) PCT No.: PCT/JP2012/082868
§ 371 (c)(1),
(2) Date: Jun. 17, 2014

(87) PCT Pub. No.: WO2013/099719
PCT Pub. Date: Jul. 4, 2013

(65) Prior Publication Data
US 2014/0353142 A1 Dec. 4, 2014

(30) Foreign Application Priority Data

Dec. 27, 2011 (JP) .................................. 2011-285545
Apr. 10, 2012 (JP) .................................. 2012-089187
Sep. 19, 2012 (WO) .................. PCT/JP2012/073873

(51) Int. Cl.
*H01J 37/32* (2006.01)
*H01J 37/09* (2006.01)
(Continued)

(52) U.S. Cl.
CPC ............... *H01J 37/09* (2013.01); *C23F 4/00* (2013.01); *H01F 41/34* (2013.01); *H01J 37/321* (2013.01);
(Continued)

(58) Field of Classification Search
CPC ... C23F 4/00; H01F 41/34; H01J 37/09; H01J 37/321; H01J 37/32357; H01J 37/32651;
(Continued)

(56) References Cited

U.S. PATENT DOCUMENTS 5,540,800 A * 7/1996 Qian .................... C23C 16/507
118/723 I
6,149,760 A 11/2000 Hama
(Continued)

FOREIGN PATENT DOCUMENTS

JP      11-251303 A    9/1999
JP     2000-133497 A   5/2000
(Continued)

OTHER PUBLICATIONS

JP 2008-305558 dated Dec. 2008.*
(Continued)

*Primary Examiner* — Rodney McDonald
(74) *Attorney, Agent, or Firm* — Fitzpatrick, Cella, Harper & Scinto

(57) ABSTRACT

In order to easily exchange a depleted dielectric member in a substrate processing apparatus, a faraday shield provided opposite to an antenna across a component member made of a dielectric, a first dielectric member provided opposite to the antenna across the component member and the faraday shield, and a second dielectric member provided opposite to the antenna across the component member, the faraday shield, and the first dielectric member are provided, and the second dielectric member is placed on a protrusion part (Continued)

formed on a vacuum container in the substrate processing apparatus.

16 Claims, 8 Drawing Sheets

(51) Int. Cl.
    *C23F 4/00*     (2006.01)
    *H01F 41/34*     (2006.01)
    *H01J 37/34*     (2006.01)
    *H05H 1/46*     (2006.01)
    *H01L 43/12*     (2006.01)

(52) U.S. Cl.
    CPC .. *H01J 37/32357* (2013.01); *H01J 37/32651* (2013.01); *H01J 37/3411* (2013.01); *H01L 43/12* (2013.01); *H05H 1/46* (2013.01); *H05H 2001/4667* (2013.01)

(58) Field of Classification Search
    CPC ........ H01J 37/3411; H01L 43/12; H05H 1/46; H05H 2001/4667
    USPC ........ 118/723 I, 723 IR; 204/192.34, 298.36, 204/298.11; 156/345.48
    See application file for complete search history.

(56) References Cited

U.S. PATENT DOCUMENTS

| | | | |
|---|---|---|---|
| 6,685,799 B2 * | 2/2004 | Davis | H01J 37/32082 118/723 I |
| 7,060,194 B2 | 6/2006 | Kodaira et al. | |
| 7,413,673 B2 | 8/2008 | Lohokare et al. | |
| 7,571,697 B2 | 8/2009 | Benjamin et al. | |
| RE40,951 E | 11/2009 | Kodaira et al. | |
| 8,536,539 B2 | 9/2013 | Hirayanagi et al. | |
| 8,540,852 B2 | 9/2013 | Watanabe et al. | |
| 2002/0129903 A1 | 9/2002 | Davis et al. | |
| 2003/0067273 A1 | 4/2003 | Benjamin et al. | |
| 2010/0133235 A1 | 6/2010 | Morikawa et al. | |
| 2011/0132540 A1 * | 6/2011 | Sakka | H01J 37/321 156/345.3 |

FOREIGN PATENT DOCUMENTS

| | | |
|---|---|---|
| JP | 2002-64083 A | 2/2002 |
| JP | 2004-524692 A | 8/2004 |
| JP | 2005-42143 A | 2/2005 |
| JP | 2005-535117 A | 11/2005 |
| JP | 2008-109155 A | 5/2008 |
| JP | 2008-305558 A | 12/2008 |
| JP | 2009-129817 A | 6/2009 |
| JP | 2011-146409 A | 7/2011 |
| JP | 2011-146690 A | 7/2011 |
| JP | 2012-9659 A | 1/2012 |
| JP | 2012-138411 A | 7/2012 |
| KR | 2010-0010640 A | 2/2010 |
| KR | 2010-0016266 A | 2/2010 |
| KR | 2011-0102494 A | 9/2011 |
| WO | 2003-026364 A3 | 3/2003 |
| WO | 2007/032379 A1 | 3/2007 |

OTHER PUBLICATIONS

Notice of Final Rejection to Patent Application dated Nov. 2, 2015 in Korean Application No. 10-2014-7006125 (5 pages).
International Search Report issued in International Application No. PCT/JP2012/082868, dated Apr. 2, 2014 (2 pages).
Full English Translation of Korean office action in corresponding application No. 10-2014-7006125 dated Feb. 25, 2015 (6 pages).
Full English Translation of Japanese office action in corresponding application No. 2013-551641 dated Mar. 17, 2015 (8 pages).
Full English Translation of Taiwanese office action in corresponding application No. 101150097 dated Dec. 23, 2014 (6 pages).
International Preliminary Report on Patentability and Written Opinion issued in PCT/JP2012/082868, dated Jul. 1, 2014 (11 pages).
Notice of Final Rejection to Patent Application dated Aug. 22, 2015 in Korean Application No. 10-2014-7006125 (5 pages).
Full English Traslation of Trial Decision in corresponding Korean Application No. 2014-7006125 dated Mar. 24, 2017 (15 pages including translation).

* cited by examiner

SUBSTRATE PROCESSING APPARATUS, ETCHING METHOD OF METAL FILM, AND MANUFACTURING METHOD OF MAGNETORESISTIVE EFFECT ELEMENT

TECHNICAL FIELD

The present invention relates to a substrate processing apparatus, an etching method of a metal film using the same, and a manufacturing method of a magnetoresistive effect element.

BACKGROUND ART

A substrate processing is performed by use of plasma in manufacturing various electronic components. Such a processing apparatus using plasma (which will be denoted as "plasma processing apparatus" below) generally employs an apparatus which is provided with a power-on antenna outside a discharging area in a vacuum container and is directed for generating induction coupling plasma inside the vacuum container by application of a high frequency (see Patent Literature 1 and Patent Literature 2). A high frequency voltage generated at the antenna is electrostatically coupled with plasma, and thus a so-called self-bias potential is generated on the inner wall of the chamber so that the inner wall of the vacuum container is sputtered and scraped. In order to solve such etching on the inner wall of the vacuum container, there is proposed, a plasma processing apparatus in which a faraday shield at a floating potential for earth is installed between two dielectrics provided adjacent to the antenna, thereby preventing etching on the inner wall of the vacuum container (see Patent Literature 3).

PRIOR ART REFERENCE

Patent Literatures

Patent Literature 1: Japanese Patent Application Laid-Open No. 2005-42143
Patent Literature 2: Japanese Patent Application Laid-Open No. 2011-146690
Patent Literature 3: Japanese Patent Application Laid-Open No. 2011-146409

SUMMARY OF THE INVENTION

Problem to be Solved by the Invention

When a film formed on a substrate is etched by an etching apparatus, part of scattered etched material adheres to the inner wall of a vacuum container. When the etched material is a dielectric, a processing property of the apparatus is not influenced, but when it is a metal film, there arise a problem that power from an antenna does not propagate into the vacuum container and plasma is difficult to generate and maintain. In order to solve the problem, there is assumed a method for positively etching the inside of a dielectric thereby to remove the metal film adhered in an area opposite to the antenna. At this time, the inside of the dielectric is also etched, and thus the dielectric needs to be periodically exchanged.

In the apparatus described in Patent Literature 3, however, a dielectric has to be exchanged after the antenna provided on the dielectric, the dielectric on the atmosphere side and a faraday shield are removed. As a result of the study by the present inventor, it is turned out that if distances between the antenna and the inner wall of the discharge container are non-uniform, a density distribution of plasma formed inside the discharge container immediately below the antenna deteriorates. Therefore, in order to obtain a predetermined performance in the plasma processing apparatus, predetermined values need to be maintained at both a distance between the antenna and the inner wall of the discharge container and a distance between the antenna and the faraday shield, An exchange of the antenna and the faraday shield on each maintenance can cause a deterioration in reproducibility of the substrate processing, On the other hand, there is considered a structure in which sealing is applied between the dielectric adjacent to the antenna and the vacuum container, and the faraday shield and the dielectric exposed to plasma are provided in vacuum. In the structure, however, the faraday shield is exposed to etching gas around the dielectric, and thus when the etching gas is reactive gas, the faraday shield reacts with the etching gas so that the property of the faraday shield changes and the plasma property changes. Further, a space in which the faraday shield is provided and a space in which plasma is generated can be separated from each other by sealing the dielectric exposed to plasma and the vacuum container, but there arise a problem that the maintenance work is complicated.

The present invention has been made in order to solve the above problems, and it is an object thereof to provide a substrate processing apparatus capable of easily exchanging a dielectric exposed to plasma, and to provide an etching method capable of stably etching a metal film for a long time.

Means for Solving the Problem

A gist of the present invention is to fix an antenna on the outer wall of a dielectric partitioning a discharging area, to provide a faraday shield at a floating potential for the earth on the inner wall, to coat the faraday shield, with a first dielectric having an anti-plasma property, to place a second dielectric opposite to the antenna and closer to plasma than the dielectric, to enable the second dielectric to be easily exchanged, and to prevent the faraday shield from changing in its property due to etching gas, An aspect of the present invention in order to solve the above problem is a substrate processing apparatus including a vacuum container having a processing space in which a substrate is processed and a plasma forming space in which plasma is formed, a component member made of a dielectric, which is part of the vacuum container and configures at least part of the plasma forming space, a conductive member fixed on the component member, a faraday shield at a floating potential which is fixed on the plasma forming space side of the component member and opposite to the conductive member across the component member, a first dielectric member for covering the faraday shield, and a second dielectric member provided opposite to the conductive member across the component member, the faraday shield and the first dielectric member, wherein the vacuum container has a protrusion part, and the second dielectric member is exchangeably provided on the protrusion part.

Another aspect of the present invention is an etching method of a metal film formed on a substrate by use of a substrate processing apparatus, the substrate processing apparatus including a vacuum container having a processing space in which a substrate is processed and a plasma forming space in which plasma is formed, a component member made of a dielectric, which is part of the vacuum container and configures at least part of the plasma forming space, a conductive member fixed on the component member, a faraday shield at a floating potential which is fixed on the plasma forming space side of the component member and opposite to the conductive member across the component member, a first dielectric member for covering the faraday shield, and a second dielectric member provided opposite to the conductive member across the component member, the faraday shield and the first dielectric member, wherein the vacuum container has a protrusion part, and the second dielectric member is exchangeably provided on the protrusion part.

EFFECTS OF THE INVENTION

With the substrate processing apparatus according to the present invention, it is possible to easily exchange a dielectric exposed to plasma and to prevent a substrate processing property from varying on maintenance. Further, with the etching method according to the present invention, it is possible to stably etch a metal film for a long time.

MODE FOR CARRYING OUT THE INVENTION

Figure 1:
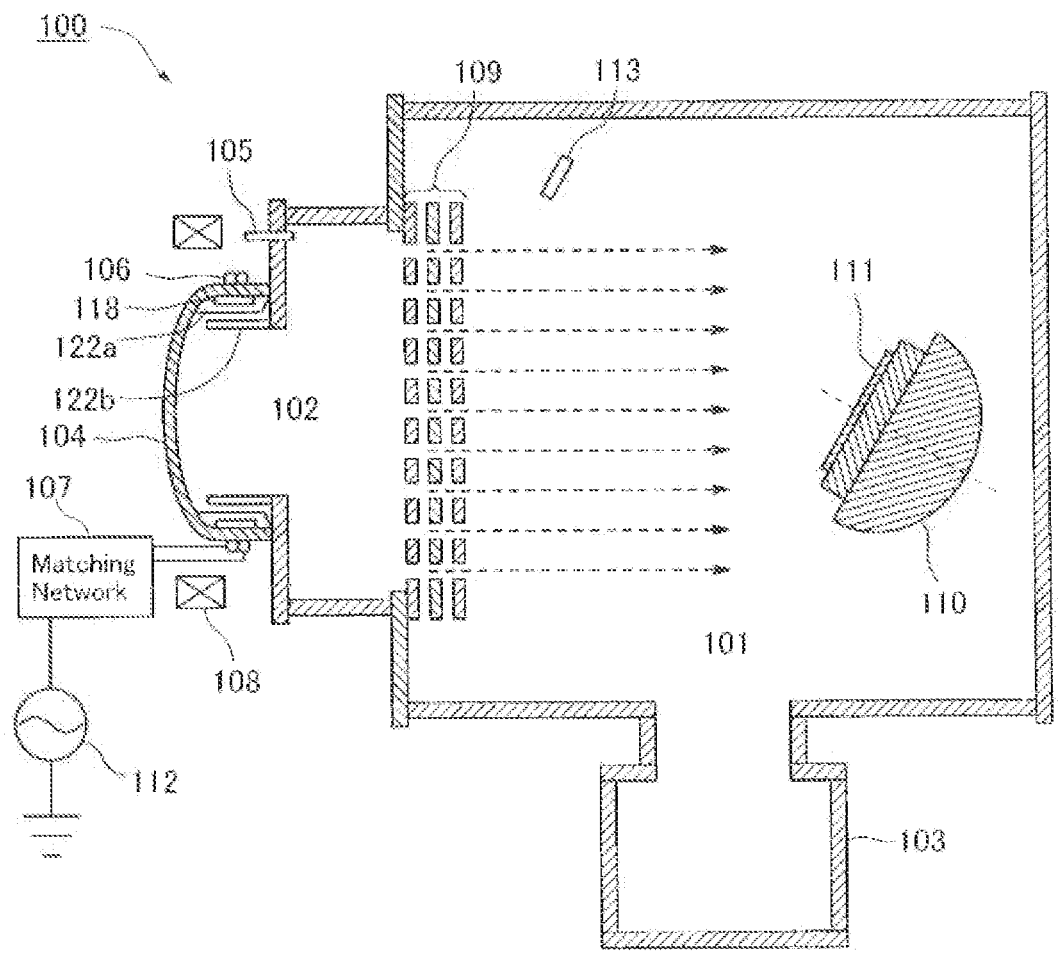
FIG. 1 is a diagram for explaining an ion beam etching apparatus as an example of substrate processing apparatus according to the present invention.

Embodiments according to the present invention will be described below with reference to the drawings. The present invention is not limited to the embodiments, and may be changed as needed without departing from the sprit thereof. Same reference numerals are denoted to the same functions in the drawings described later, and a repeated description thereof may be omitted.

FIG. 1 schematically illustrates an ion beam etching apparatus as an example of a plasma processing apparatus using a discharge container according to the present invention.

The ion beam etching apparatus according to the present invention has a vacuum container 100 with a processing space 101 and a plasma forming space 102.

There are installed in the plasma forming space 102, as plasma forming means for forming plasma, a bell jar (discharge container) 104 which configures the plasma forming space, a gas introduction part 105, an antenna 106 made of a conductive member for generating an induction magnetic field in the bell jar 104, a discharging power supply 112 for supplying high frequency power (source power) to the antenna 106, a matching network 107 provided between the discharging power supply 112 and the antenna 106, and an electromagnetic coil 108. The bell jar 104 configures part of the vacuum container 100. A grid 109 is provided on a boundary with the processing space 101. High frequency power supplied from the discharging power supply 112 is supplied to the antenna 106 so that plasma is formed, in the plasma forming space 102 inside the bell jar 104. The bell jar 104 comprises a faraday shield 118 on the inner wall thereof.

An exhaust pump 103 is provided in the processing space 101. A substrate holder 110 is provided inside the processing space 101, and a substrate 111 is fixed by the substrate holder 110.

After plasma is formed in the plasma forming space 102, a voltage is applied to the grid 109 to extract ions inside the plasma forming space 102 as a beam. The extracted ion beam, is electrically neutralized by a neutralizer 113 to be irradiated on the substrate 111.

Figure 2:
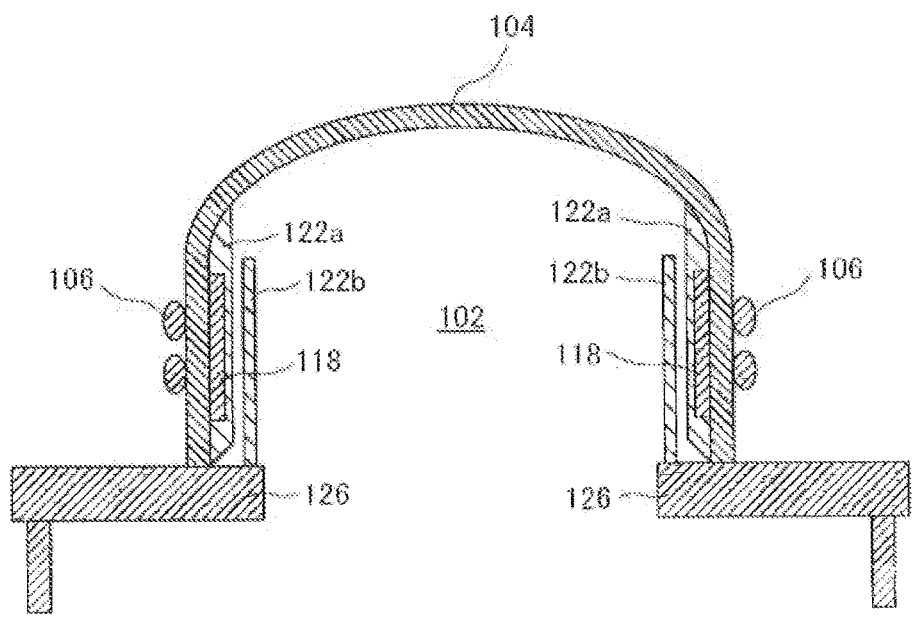
FIG. 2 is a diagram for explaining a discharge container according to one embodiment of the present invention.

FIG. 2 illustrates the enlarged bell jar 104 and its surroundings which are characteristic parts of the present invention. Some components of the apparatus illustrated in FIG. 1 are omitted from the illustration.

The faraday shields 118 according to the present invention are fixed on the inner wall of the bell jar 104 as illustrated in FIG. 2. The faraday shield 118 may be fixed with various methods. For example, there may be employed a method for forming a metal film as the faraday shield 118 fixed on the inner wall of the bell jar 104 by vacuum deposition or electroless plating a faraday shield made of a conductor, or spraying a metal such as aluminum. The faraday shields 118 are preferably formed by spraying a metal in terms of productivity of the bell jar 104.

A material of the bell jar 104 employs an insulative material, and suitably employs quartz excellent in its workability. A material capable of applying a high frequency and discharging the inside of the bell jar 104 is employed for the antenna 106 as a conductive part, and copper or aluminum is employed, for example. The faraday shield 118 employs a conductor, and employs aluminum, copper, titanium, molybdenum, tantalum, conductive carbon or the like, for example. A non-magnetic material is desirably employed for reducing a loss due to an inductive current.

The faraday shield 118 has a plurality of electrodes extending perpendicular to the antenna 106 positioned on the outer periphery of the bell jar 104, and along the inner wall of the bell jar 104. One end or both ends of each electrode are electrically connected to an electrode extending in the circumferential direction in order to set the electrodes arranged in the circumferential direction at the same potential. The connection positions are desirably away from the antenna 106 such that a power loss due to an inductive current does not cause a practical problem. The faraday shield 118 is entirely configured at a floating potential for the earth.

If an aperture ratio of the electrodes arranged in the circumferential direction is too large, a cleaning effect of the inner wall of the bell jar 104 is reduced, and if it is too small, a power use efficiency by the antenna 106 is reduced, and the aperture ratio is desirably on the order of 50%.

The faraday shield 118 is desirably thin, but needs to be thicker than a skin depth relative to a frequency to be used. For example, when the material of the faraday shields 118 is aluminum and power applied to the antenna 106 is a high frequency of 13.56 MHz, the thickness of the faraday shield 118 may be around 20 μm or more.

The antenna 106 are fixed on the outer periphery on the outer wall of the bell jar 104 opposite to the faraday shield 118. The antenna 106 may be fixed with various methods. For example, a method for forming the antenna 106 on the outer wall of the bell jar 104 by spraying or electroless plating, a method for forming the antenna 106 to be fixed on the outer wall by adhering a metal plate on the outer wall of the bell jar 104, or the like may be employed. A conductive wire may be wound and adhered around, the antenna. Adhesion of a metal thin plate is particularly preferable in terms of low power loss and easy power supply.

According to the present invention, a faraday shield is a metallic lattice electrode which is provided between, the antenna and plasma, is at a floating potential for the earth, allows a high frequency magnetic field radiated from the antenna to pass through and to couple with plasma directly, and makes a circumferentially non-uniform high frequency electric field radiated from the antenna uniform to couple with plasma.

It is possible to generate a high frequency field between the faraday shield and plasma and to control a state of the inner wall of the discharge container due to a sputtering operation by use of the faraday shield. Particularly, when deposits are adhered on the inner wall of the discharging wall, the sputtering operation whose rate is higher than the rate at which the deposits are adhered is set, thereby preventing the inner wall of the discharge container from being deposited.

According to the present invention, the antenna 106 and the faraday shield 118 are fixed on the bell jar 104, and thus the distance between the antenna 106 and the faraday shield. 118 can be kept constant in terms of a workability accuracy of the bell jar 104.

According to the present invention, the fixing of the antenna 106 and the faraday shield 118 is an integration of the antenna 106 and the faraday shield 118 with the bell jar 104 by use of any method described above.

The faraday shield 118 is coated with a shielding member 122a, and the faraday shield 118 is configured not to be exposed to etching gas introduced into the plasma forming space 102. The shielding member 122a may employ various structures. For example, it may be made of a plate-shaped quarts and may be attached on the inner wall of the bell jar 104 to seal the space provided with the faraday shield 118. A dielectric film covering the faraday shield US may be formed by deposition. However, in consideration of adhesion with the bell jar 104, the shielding member 122a is desirably formed by spraying. When the shielding member 122a is formed by spraying, alumina ($Al_2O_3$), yttria ($Y_2O_3$) or zirconia ($ZrO_2$) is suitably employed. Yttria is particularly desirable due to its chemical stability.

Furthermore, according to the present invention, a shielding member 122b is provided opposite to the antenna 106 across the bell jar 104, the faraday shield 118 and the shielding member 122a. The shielding member 122b is placed on a protrusion part 12 6 formed on a chamber wall 100a configuring part of the vacuum container 100, and is easily exchangeable. A material of the shielding member 122b may suitably employ quartz.

The shielding member 122b is present opposite to the antenna 106 and closer to the plasma forming space 102 than the shielding member 122a, and thus its surface is scraped due to incident ions by a self-bias generated near the antenna 106. However, the shielding member 122b is placed, on the protrusion part 126, and has only to be exchanged with other shielding member 122b on maintenance, The shielding member 122a covering the faraday shield 118 is present between the antenna 106 and the shielding member 122b, and thus ions accelerated by the self-bias are not made incident directly. Therefore, an exchange period of the shielding member 122a may be much longer than that of the shielding member 122b.

A method for installing the shielding member 122b may employ various forms other than the way the protrusion part 126 is provided on the chamber wall 100a and the shielding member 122b is placed thereon. For example, the protrusion part 126 may be formed on the bell jar 104, or the shielding member 122b may be screwed on part of the chamber wall 100a. However, there is desirably configured such that the shielding member 122b is placed on the protrusion part 126 formed on the chamber wall 100a in terms of damage prevention and easy exchange.

The structure of the discharging apparatus having the antenna 106, the bell jar 104, the faraday shield 113 and the shielding members 122a and 122b according to the present invention is effective particularly when it is provided in the substrate processing apparatus for etching a metal film, When an etching processing such as IBE or RIE is performed on a substrate formed with a metal film, etched metal is scattered and part of it adheres to areas, which face the substrate, of the inner wall of the bell jar 104 or the shielding member 122b. When a metal film adheres on an area opposite to the antenna 106, power from the antenna 106 into the plasma forming space 102 is consumed by a current flowing in the metal film, and plasma is difficult to generate and to maintain in the plasma forming space 102.

The metal film made of such an etched material can be removed by incident ions due to a self-bias generated near the antenna 106. However, it is actually difficult to make an adhesion rate of the etched material and an etching rate by incident ions equal, and it is necessary to more increase the etching rate than the adhesion rate.

Therefore, when a metal film is etched in the substrate processing apparatus, a member opposite to the antenna 106 and provided at the innermost side of the plasma forming space 102 is always etched by incident ions. According to the present invention, the shielding member 122b etched by incident ions is only placed on the protrusion part 126 and is easily exchangeable, thereby being particularly effective in etching a metal film.

Uniformity of plasma at each point (in the substrate circumferential direction according to the present, invention) in the area opposite to the antenna 106 can be enhanced by use of the faraday shield at a floating potential. Thus, the metal film adhered to the shielding member 122b can be uniformly and preferably etched at each point in the area opposite to the antenna 106, and plasma can be stably generated and maintained, for a long time.

When the bell jar 104 is thin, a self-bias potential generated at a face on the plasma forming space 102 side of the shielding member 122b and opposite to the faraday shield 118 may reflect a shape of the faraday shield. Consequently, a striped, area from which deposits cannot be removed can be generated. In order to avoid the phenomenon, the thickness of the bell jar 104 is desirably 1 mm or more.

In order to obtain a cleaning effect of the metal film adhered to the shielding member 122b by use of the faraday shield 118, a self-bias voltage generated on the surf ace of the shielding member 122b needs to be defined in a proper range. If the self-bias potential is too low, the cleaning is not enough, and if it is too high, a failure such as adhesion of dielectric thin film onto a non-processed substrate or the like or shortened life of dielectric shield is caused.

A proper self-bias potential is different depending on a material of the shielding member 122b or a component of the adhered deposits, or the like, but is set within a range of several hundred V to several kV in use of a standard apparatus. This value is higher than, a threshold at which a sputtering phenomenon occurs and lower than a potential generated on a target surface of a general sputtered film forming apparatus.

A frequency of high frequency power assumed in the present invention is 13.56 MHz, and in the frequency band, a self-bias potential generated on the surface of the shielding member 122b is about half the high frequency voltage induced in the faraday shield 118 in actual application of an apparatus.

A high frequency voltage induced by the electrode is a value obtained by distributing a voltage applied to the antenna 106 into an electrostatic capacity between the antenna 106 and the faraday shield 118 and an electrostatic capacity between the faraday shield 118 and plasma. That is, assuming a distance as d1 and a specific permittivity as $\in1$ between the antenna 106 and the faraday shield 118, and a distance as d2 and a specific permittivity as $\in2$ between the faraday shield 118 and plasma, a relationship between a voltage Ve induced in the faraday shield and a voltage Va applied to the antenna 106 is expressed in $$Ve = Va \times (d2 \times \in1/(d1 \times \in2 + d2 \times \in1)) \quad \text{(Equation 1)}.$$

Therefore, if the specific permittivities of the bell jar 104 and the shielding members 122a, 122b are the same, the shielding members 122a and 122b are arranged between the faraday shield 118 and plasma without any gap, and a voltage applied to the antenna 106 is 5 kV, the electrode potential is 2 kV when a self-bias potential of 1 kV is desired, and thus d1=1.5×d2 is established. That is, when the thickness of the discharge container is 6 mm, the thickness of the dielectric shield may be 4 mm. In other example, when the thickness of the discharge container is 6 mm and a self-bias potential of 0.5 kV is desired, a total thickness of the shielding members 122a and 122b may be preferably 1.5 mm.

When a gap is present between the shielding members 122a and 122b or when the materials of the shielding members 122a and 122b are different from each other, $\in2$ in Equation 1 can be found by finding an average specific permittivity obtained by dividing a sum of the permittivities of the members between the faraday shield 118 and the face contacting with plasma of the shielding member 122b multiplied by the thicknesses of the members by a distance between the faraday shield 118 and the face contacting with plasma of the shielding member 122b. A specific permittivity for a gap between the shielding members 122a and 122b is assumed at 1, and it may be multiplied by a distance between the surface on the plasma forming space 102 side of the shielding member 122a and the surface on the faraday shield side of the shielding member 122b.

Each thickness or specific permittivity of the shielding members 122a, 122b and the bell jar 104 is set depending on the type of a substance to be etched on the shielding member 122b so that, a self-bias generated on the shielding member 122b can be controlled and an etching property for the shielding member 122b can be changed.

According to the present invention, a single loop antenna (which will be denoted as "SLA" below) wounded by one turn around the outer periphery of the bell jar 104 is suitably employed. This reason will be described below.

An inductance L of the loop antenna is found in the following Equation.

$$L = k \times \mu_0 \times n \times a^2 \times n^2 / b \quad \text{(Equation 2)}$$

(where k: Nagaoka coefficient, $\mu_0$: vacuum permeability, a: coil radius, b: coil length, and n: number of coil windings)

An inductance is found when the antenna 106 in the plasma apparatus according to an example is a coil as a wounded metal wire with a width of 3 mm, for example. When the antenna 106 is wounded multiple times on the outer periphery of the bell jar 104, an interval therebetween is assumed at 1 mm. Other numerical values such as k: Nagaoka coefficient, $\mu_0$=1, a=0.3 m, n=1 to 3, and b=0.003+n×0.001 m are substituted, and thus L=2.3 µH, L=8 µH and L=16.6 µH are obtained at n=1, n=2 and n=3, respectively.

As described, in the example, when a frequency of the nigh frequency is 13.56 MHz, the impedances of the antenna 106 are about 200Ω, about 680Ω, and about 1400Ω, respectively, and thus the impedance is higher as the number of windings is larger.

When high frequency power supplied to the antenna 106 is the same, a maximum value of the high frequency voltage is larger in proportion to the impedance, and a maximum value of the high frequency current is smaller. The high frequency current is increased as much as possible and insulation breakdown due to a high voltage needs to be prevented in order to generate plasma by induction coupling, and thus the impedance of the antenna 106 is desirably reduced as much as possible. That is, an area of the antenna 106 opposite to the faraday shield 118 (viewed from the faraday shield 118) and a voltage of the antenna 106 need to be reduced, and the number of turns of the antenna is desirably reduced therefor.

As described above, a proper self-bias potential needs to be generated in the faraday shield 118 in order to give an effect for cleaning the inner wall of the shielding member 122b to the faraday shield 118. However, if an antenna impedance is high and a high frequency voltage is generated in the antenna, the shielding member 122a and the shielding member 122b need to be thinned in order to control a self-bias potential. Therefore, the antenna 106 is preferably a SLA in order to positively etching substances deposited on the shielding member 122b in terms of a strength of the shielding member 122a and the shielding member 122b and an exchange period.

As to how to wind an antenna in forming a SLA, the antenna is preferably wounded by one turn on the outer periphery of the bell jar 104 in order to enhance uniformity in the substrate circumferential direction of plasma. The number of windings may be slightly larger than one turn to overlap the ends in order to adjust a plasma density distribution near the ends at a power-supply end where the antenna 106 starts being wounded on the outer periphery of the bell jar 104 and a termination end where it is away from, she outer periphery of the bell jar 104.

Figure 3:
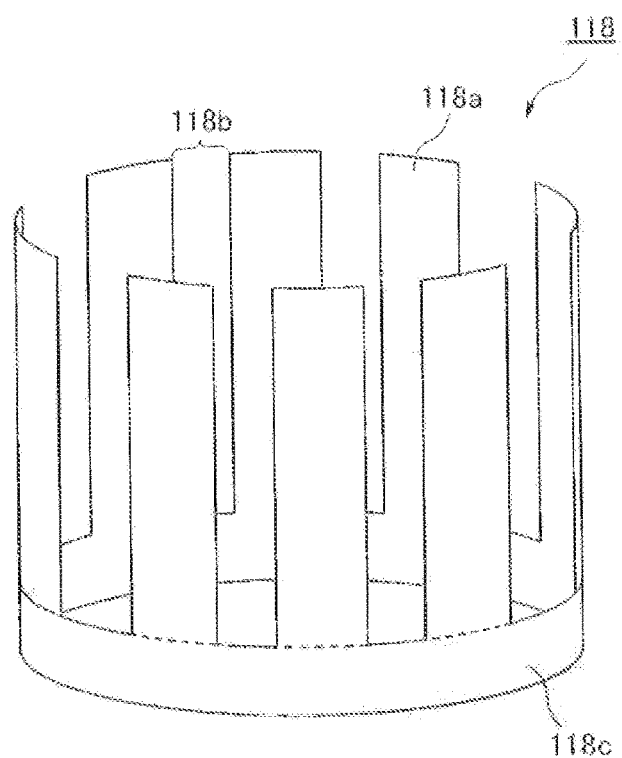
FIG. 3 is a diagram for explaining an example of a faraday shield suitable for the present invention.

FIG. 3 illustrates an example of the faraday shield 118 suitable for the present invention. The faraday shield 118 is such that conductors 118a are arranged with gaps 118b therebetween and each conductor 118a is held by a coupling part 118c. The coupling part 118c is made of a conductor.

Figure 4:
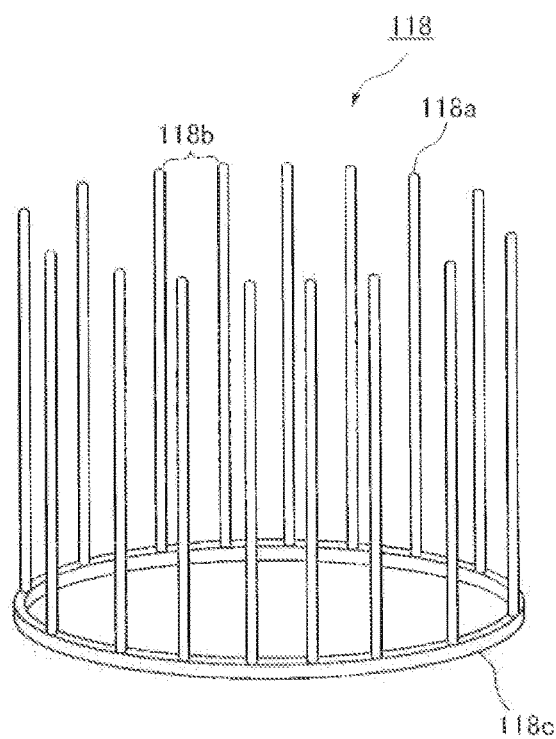
FIG. 4 is a diagram for explaining an example of a faraday shield suitable for the present invention.

FIG. 4 illustrates other example of the faraday shield 118. The faraday shield 118 illustrated in FIG. 4 is also configured of the conductors 118a, the gaps 118b and the coupling part 118c.

Other embodiment according to the present invention will be described, below with reference to FIGS. 5 to 9. A basic apparatus structure of the following embodiment is similar to that of the embodiment illustrated in FIG. 1, and the shielding member 122b, the protrusion part 126 and the like will be omitted from the illustration.

Figure 5:
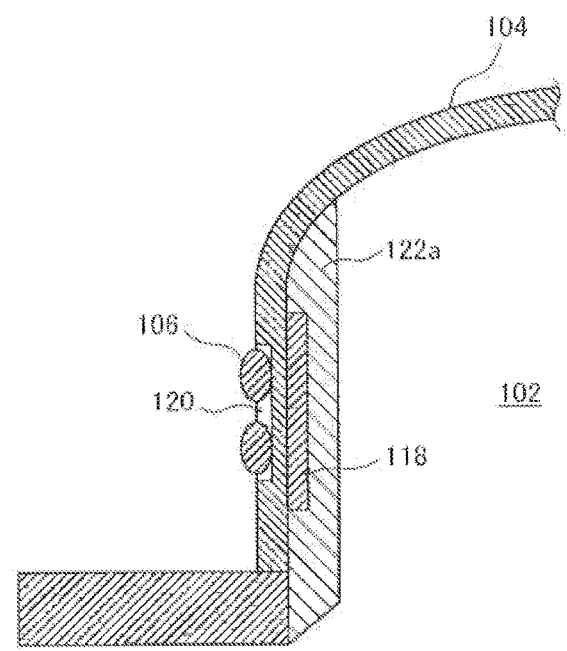
FIG. 5 is a diagram for explaining one embodiment of the present invention.

FIG. 5 illustrates other embodiment of the substrate processing apparatus according to the present invention.

In the present embodiment, a concave part 120 is formed in a fixing part of the antenna 106 on the outer wall of the bell jar 104. With the structure, the bell jar 104 can be formed in a predetermined thickness, and a desired distance between the antenna 106 and the faraday shield 118 is also enabled.

Figure 6:
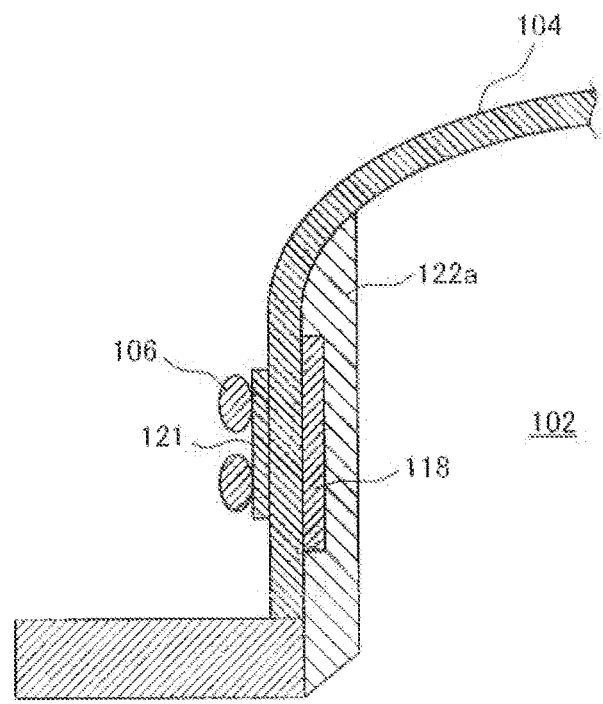
FIG. 6 is a diagram for explaining one embodiment of the present invention.

FIG. 6 illustrates other embodiment of the discharge container according to the present invention.

In the present embodiment, a convex part 121 is formed in a fixing part of the antenna 106 on the outer wall of the bell jar 104. With the structure, the bell jar 104 can be formed in a predetermined thickness, and a desired distance between the antenna 106 and the faraday shield 118 is also enabled.

Figure 7:
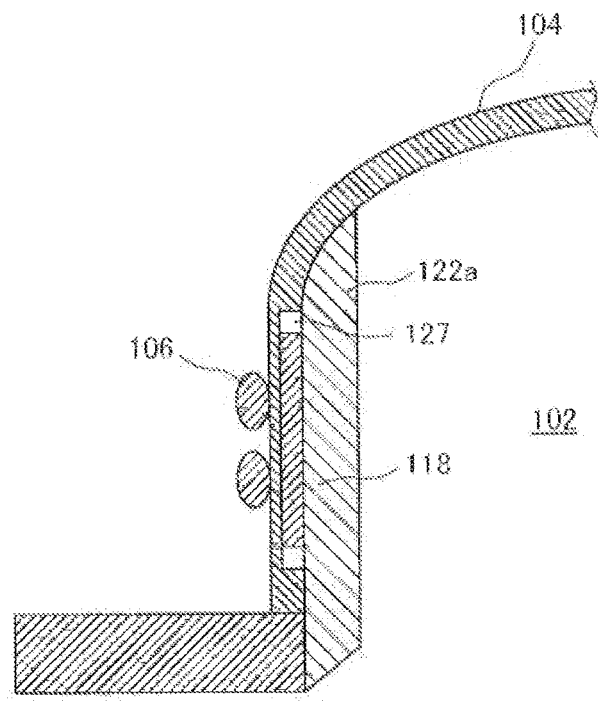
FIG. 7 is a diagram for explaining one embodiment of the present invention.

FIG. 7 illustrates other embodiment of the discharge container according to the present invention, In the present embodiment, a concave part 127 are formed in a fixing part of the faraday shield. 118 on the inner wall of the bell jar 104. With the structure, the bell jar 104 can be formed in a predetermined thickness, and a desired distance between the antenna 106 and the faraday shield 118 is also enabled.

Figure 8:
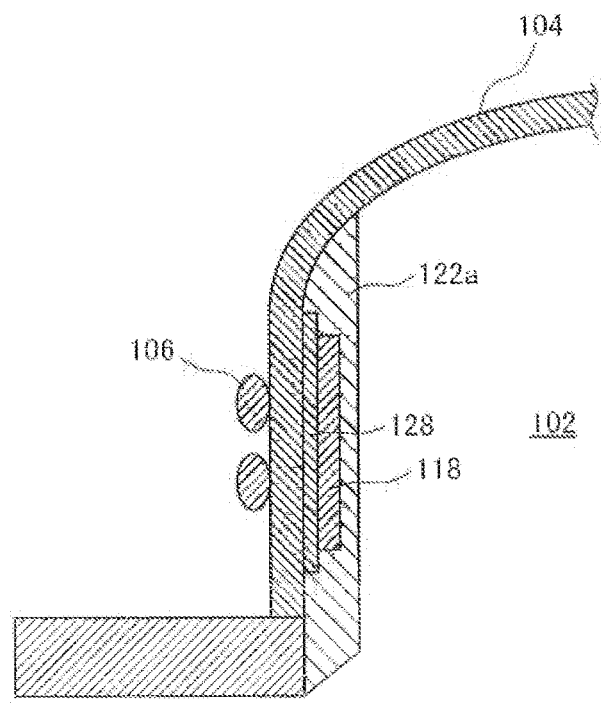
FIG. 8 is a diagram for explaining one embodiment of the present invention.

FIG. 8 illustrates other embodiment of the discharge container according to the present invention.

In the present embodiment, a convex part 128 is formed in a fixing part of the faraday shield 118 on the inner wall of the bell jar 104. With the structure, the bell jar 104 can be formed, in a predetermined thickness, and a desired distance between the antenna 106 and the faraday shield 118 is also enabled.

Figure 9:
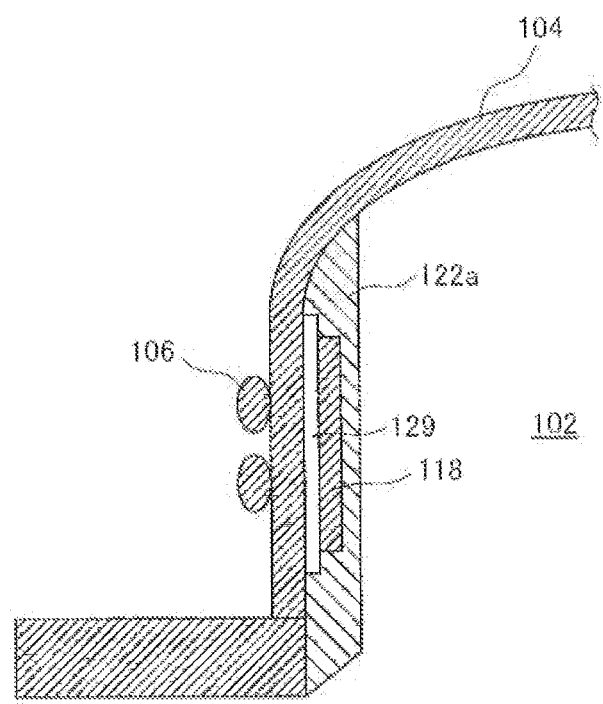
FIG. 9 is a diagram for explaining one embodiment of the present invention.

FIG. 9 illustrates other embodiment of the discharge container according to the present invention. In the present embodiment, the faraday shield 118 is formed on an intermediate layer 129. The bell jar 104 is heated while plasma is formed in the plasma forming space 102, and the faraday shield formed on the bell jar 104 is also heated. When the faraday shield 118 is formed on the bell jar 104 by deposition or spraying, the thermal expansion coefficients of a metal film constituting the faraday shield 118 and a dielectric constituting the bell jar 104 are largely different, and thus adhesion of the faraday shield 118 is reduced due to the difference in thermal expansion, which causes a problem such as film peeling.

Thus, in the present embodiment, the intermediate layer 129 is present between the bell jar 104 and the faraday shield 118, which is made of a material whose thermal expansion coefficient is larger than the material constituting the bell jar 104 and smaller than the material constituting the faraday shield 118, The intermediate layer 129 is provided so that a difference in thermal expansion between the faraday shield 118 and the member contacting with the faraday shield 118 is reduced and a deterioration in adhesion is restricted.

Further, the intermediate layer 129 is particularly effective in forming the faraday shield 118 by spraying. Particles of a film to be formed is sprayed on a base material at high energy thereby to form a film. Thus, a just-formed sprayed film is high in its temperature and large in thermal expansion, The temperature of the sprayed film lowers over time, and the thermal expansion of the film also decreases. At this time, when the film largely contracts, a problem such as peeling of the sprayed film or crack of the base material is caused.

The intermediate layer 129 is made of a material whose thermal expansion is larger than the bell jar 104 and smaller than the faraday shield 118 as in the present embodiment so that not only peeling of the faraday shield 118 but also a damage of the bell jar 104 can be restricted.

Figure 10:
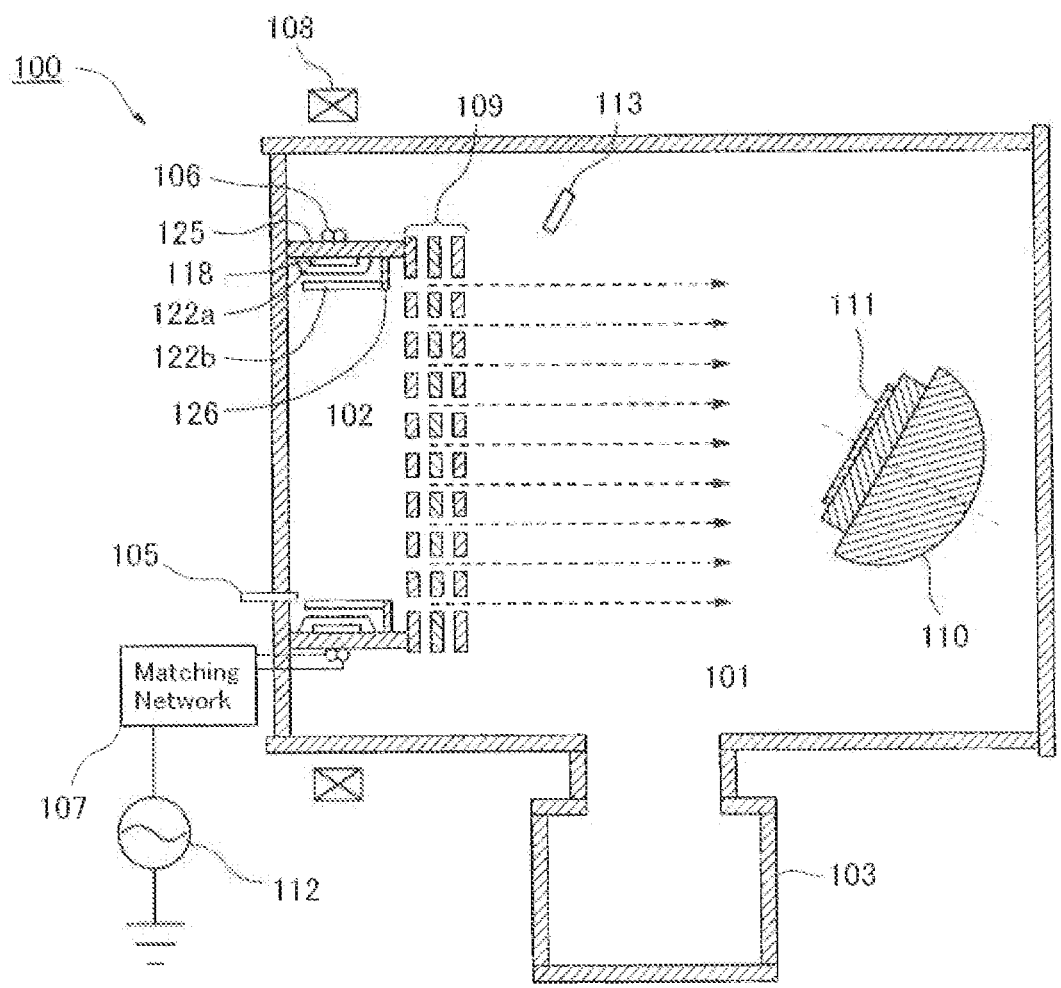
FIG. 10 is a diagram for explaining an ion beam etching apparatus according to other embodiment of the present invention.

The discharge container coupled to the outside of the vacuum chamber is illustrated in the above embodiment. However, the discharge container according to the present invention is not limited thereto, and the discharge container may be attached inside the vacuum chamber, for example. As illustrated in FIG. 10, an insulative member 125 may be provided inside the vacuum chamber and the insulative member 125 may partition the plasma forming space 102 and other space (the processing space 101 in FIG. 10) thereby to form a discharge container. In this case, the discharge container is formed with the insulative member 125 made of quartz, the inner wall of the vacuum chamber and the grid 109, for example, Then, the faraday shield 118 is fixed on the wall on the plasma forming space 102 side of the insulative member 125, and the antenna 106 is fixed on the wall, on other space side.

There has been described in the above embodiment the case in which the substrate processing apparatus is an IBE apparatus. The substrate processing apparatus according to the present invention may be a RIE apparatus, PECVD (Plasma Enhanced Chemical Vapor Deposition) apparatus, or the like other than the IBE apparatus.

An embodiment in which the present invention is used for an RIE apparatus will be described below with reference to FIG. 11.

The RIE apparatus according to the present embodiment comprises a vacuum container 200. The vacuum container 200 has therein a processing space 201 in which plasma is formed and a substrate processing is performed. The vacuum container 200 is configured of chamber walls 200a, 200b and a dielectric window 204. A substrate holder 210 can hold a substrate 211, and comprises a power supply 231 for applying a predetermined voltage to the substrate 211, and a matching network 230. Further, it comprises a gas introduction part 205 for introducing etching gas into the processing space 201, and an exhaust means 203 for exhausting the inside of the vacuum container 200. The dielectric window 204 is fixed with an antenna 206 for powering on the processing space 201, and the antenna 206 are connected to the matching network 207 and the power supply 212.

A faraday shield 218 at a floating potential for the earth is formed on the processing space 201 side of the dielectric window 204, and a shielding member 222a for sealing the faraday shield 218 is formed. A protrusion part 226 is formed on the chamber wall 200a, and a shielding member 222b can be placed thereon.

A self-bias is generated near the antenna 206 and ions in plasma formed in the processing space 201 are accelerated toward the antenna 206, but the shielding member 222b is present opposite to the antenna 206 across the dielectric window 204, the faraday shield 218 and the shielding member 222a, and thus the ions are made incident into the shielding member 222b, The shielding member 222b is placed on the protrusion part 226, and thus can be easily exchanged.

EXAMPLE 1

An example in which etching is performed by use of the substrate processing apparatus according to the present invention will be described below. In the present example, a substrate processing is performed by use of the IBE apparatus illustrated in FIG. 1.

Figure 12:
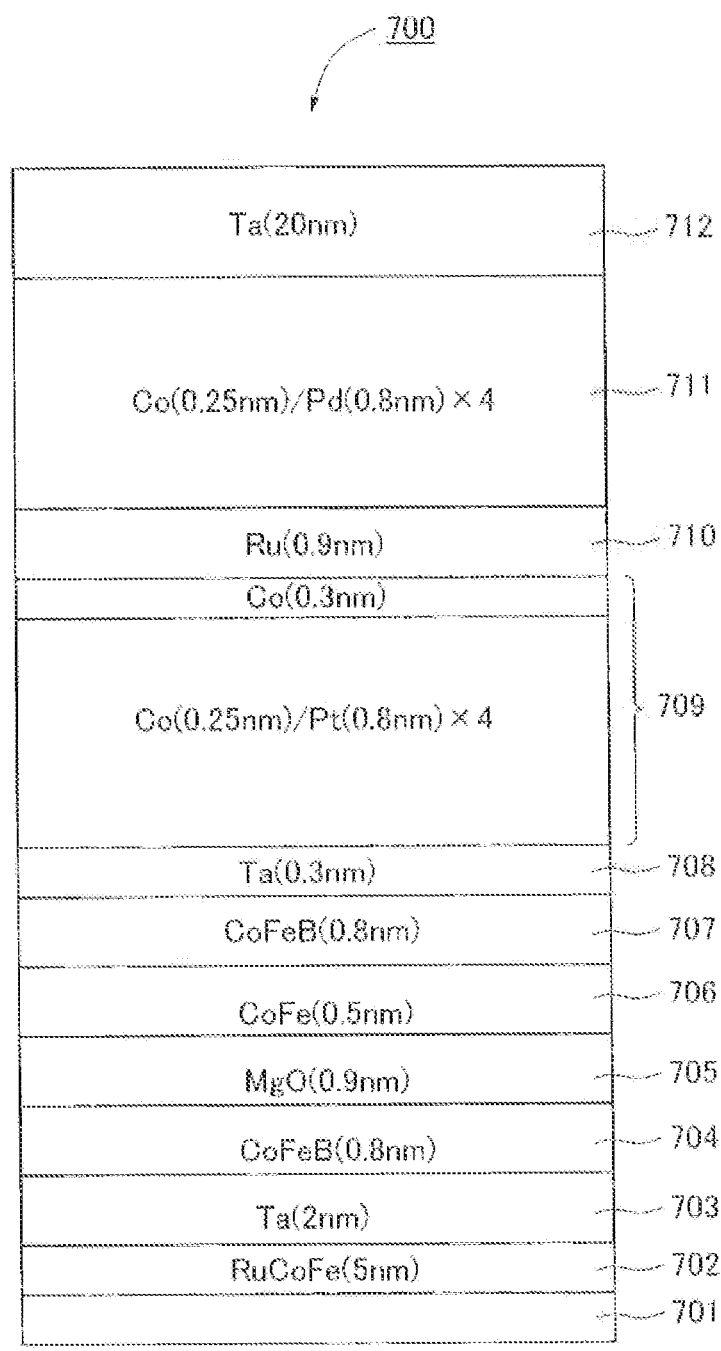
FIG. 12 is a diagram for explaining an example of a substrate processing using the ion beam etching apparatus according to the present invention.

FIG. 12 illustrates a schematic diagram of a stack structure of a perpendicular magnetization TMR element (which will be also denoted as P-TMR element below) 700 as an example of an element capable of being processed by the IBE apparatus according to the present invention. The P-TMR element is formed such that a RuCoFe layer 702 and a Ta layer 703 as buffer layers, a CoFeB layer 704 as a free layer, a MgO layer 705 as a barrier layer, a CoFe layer 706 as a first reference layer, a CoFeB layer 707 as a second reference layer, a Ta layer 703 as an orientation isolation layer, a third reference layer 709, a Ru layer 710 as a non-magnetic intermediate layer, a fourth reference layer 711, and a Ta layer 712 as a cap layer are formed, on a substrate 701 in this order from the lowest layer. MgO is suitable for the barrier layer in order to obtain a high MR ratio. Additionally, an oxide containing at least one or two of magnesium (Mg), aluminum (Al), titanium (Ti), zinc (Zn), hafnium (Hf) and germanium (Ge) may be employed. The third reference layer is formed in a stack structure of Co and Pd, and in the present example, four layers of Co/Pd are alternately stacked and then a Co film is formed. The fourth reference layer 711 is formed in a stack structure of Co/Pd, in which 14 layers of Co and Pd are alternately stacked.

As described above, the P-TMR element is made of many metal films, and thus metal particles are scattered in etching the stacked films and part of them is deposited on the shielding member 122b. However, a self-bias is set such that etching is performed at a higher rate than a rate at which the metal particles are deposited on the surface of the shielding member 122b, thereby preventing the metal films from being stacked on the shielding member 122b. The depleted shielding member 122b can be easily exchanged, and thus an improvement in productivity can be desired.

Figure 11:
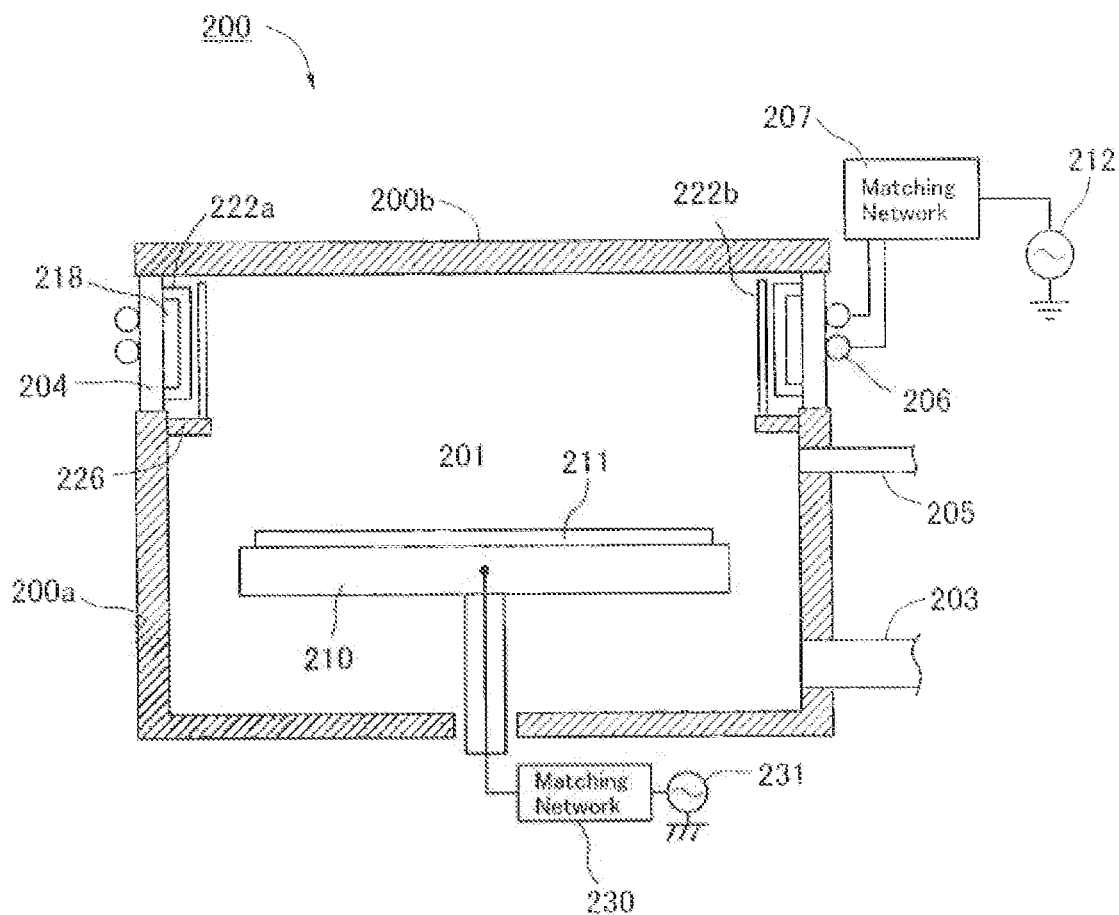
FIG. 11 is a diagram for explaining a reactive ion etching apparatus as an example of a substrate processing apparatus according to the present invention.

The P-TMR element is processed by use of the IBE apparatus illustrated in FIG. 1 in the present example, but may be processed by use of the RIE apparatus illustrated in FIG. 11. This is because also with RIE, part of the etched material is physically etched and scattered metal particles can be deposited on the shielding member 122b.

The substrate processing apparatus according to the present invention is applicable in processing other metal film in addition to processing P-TMR elements described above, and obtains the effects of the present invention. It is widely applicable to processing a metal film such as removing a metal film on a element side wall by IBE after patterning, or flattening a metal film surface in addition to the step of forming a pattern of a P-TMR element described in the example.

The invention claimed is:

1. A substrate processing apparatus comprising:
a vacuum container having a processing space in which a substrate is processed and a plasma forming space in which plasma is formed;
a component member made of a dielectric which is part of the vacuum container and configures at least part of the plasma forming space;
a conductive member fixed on the component member;
a faraday shield fixed on the plasma forming space side of the component member;
a first dielectric member coating the plasma forming space side of the faraday shield; and
a second dielectric member provided on the plasma forming space side of the first dielectric member,
wherein the conductive member is provided on the component member on a side opposite to the plasma forming space side,
wherein the faraday shield is fixed to a position opposite to the conductive member with the component member therebetween,
wherein the first dielectric member is formed to coat the faraday shield so that the faraday shield has a floating potential,
wherein the second dielectric member is provided at a position opposite to the faraday shield with the first dielectric member therebetween, and
wherein the vacuum container has a protrusion part, and the second dielectric member is exchangeably provided on the protrusion part.

2. The substrate processing apparatus according to claim 1, wherein the second dielectric member is placed on the protrusion part.

3. The substrate processing apparatus according to claim 1 or 2, wherein the first dielectric member is formed by spraying.

4. The substrate processing apparatus according to claim 1 or 2, wherein the faraday shield is formed by spraying.

5. The substrate processing apparatus according to claim 4, wherein an intermediate layer whose thermal expansion coefficient is higher than the faraday shield and lower than the component member is present between the faraday shield and the component member.

6. The substrate processing apparatus according to claim 5, wherein the intermediate layer is a dielectric formed by spraying.

7. The substrate processing apparatus according to claim 1 or 2, wherein the component member and the second dielectric member are made of quartz.

8. The substrate processing apparatus according to claim 1 or 2, wherein the conductive member is formed on the component member by deposition or spraying.

9. The substrate processing apparatus according to claim 1 or 2, wherein the conductive member is formed by bonding a metal plate on the component member.

10. An etching method of a metal film formed on a substrate by use of a substrate processing apparatus, the substrate processing apparatus comprising:
a vacuum container having a processing space in which a substrate is processed and a plasma forming space in which plasma is formed;
a component member made of a dielectric which is part of the vacuum container and configures at least part of the plasma forming space;
a conductive member fixed on the component member;
a faraday shield fixed on the plasma forming space side of the component member;
a first dielectric member coating the plasma forming space side of the faraday shield; and
a second dielectric member provided on the plasma forming space side of the first dielectric member,
wherein the conductive member is provided on the component member on a side opposite to the plasma forming space side, wherein the faraday shield is fixed to a position opposite to the conductive member with the component member therebetween, wherein the first dielectric member is formed to coat the faraday shield so that the faraday shield has a floating potential, wherein the second dielectric member is provided at a position opposite to the faraday shield with the first dielectric member therebetween, and wherein the vacuum container has a protrusion part, and the second dielectric member is exchangeably provided on the protrusion part.

11. The etching method of a metal film according to claim 10, wherein a self-bias is generated on the surface of the second dielectrc member due to power supplied to the conductive member, and the self-bias is set at a value such that an etching rate of the metal is higher than a rate at which a metal in the metal film is deposited on the surface of the second dielectric member.

12. The etching method of a metal film according to claim 10 or 11, wherein the etching method is an ion beam etching method for etching by use of an ion beam formed by extracting ions from the plasma.

13. The etching method of a metal film according to claim 10 or 11 wherein the etching method is a reactive ion etching method for etching by pulling in ions from the plasma by a voltage applied to the substrate.

14. A method for manufacturing a magnetoresistive effect element manufactured by use of the etching method according to claim 10 or 11.

15. The substrate processing apparatus according to claim 1, wherein the second dielectric member is exchangeably provided on the protrusion part with a predetermined interval between the first dielectric member and the second dielectric member.

16. The etching method of a metal film according to claim 10, wherein the second dielectric member is exchangeably provided on the protrusion part with a predetermined interval between the first dielectric member and the second dielectric member.

* * * * *